(12) United States Patent
Wang et al.

(10) Patent No.: US 12,317,678 B2
(45) Date of Patent: May 27, 2025

(54) DISPLAY PANEL AND MANUFACTURING METHOD THEREFOR, AND DISPLAY DEVICE

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Zhiqiang Wang, Beijing (CN); Li Liu, Beijing (CN); Zijian Wang, Beijing (CN); Xu Lu, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 523 days.

(21) Appl. No.: 17/791,440

(22) PCT Filed: Jun. 8, 2021

(86) PCT No.: PCT/CN2021/098934
§ 371 (c)(1),
(2) Date: Jul. 7, 2022

(87) PCT Pub. No.: WO2021/254217
PCT Pub. Date: Dec. 23, 2021

(65) Prior Publication Data
US 2023/0066009 A1 Mar. 2, 2023

(30) Foreign Application Priority Data
Jun. 19, 2020 (CN) .......................... 202010567967.3

(51) Int. Cl.
*H10K 50/87* (2023.01)
*G09G 3/3233* (2016.01)
(Continued)

(52) U.S. Cl.
CPC ........... *H10K 50/87* (2023.02); *G09G 3/3233* (2013.01); *H10K 59/65* (2023.02); *H10K 71/00* (2023.02);
(Continued)

(58) Field of Classification Search
CPC ...... H10K 71/00; H10K 59/65; H10K 59/131; H10K 59/40; H10K 59/8794; H10K 50/87; G09G 3/3233
See application file for complete search history.

(56) References Cited

U.S. PATENT DOCUMENTS

2019/0073505 A1* 3/2019 Kwon .................... H05K 1/028
2019/0205603 A1* 7/2019 Lee ......................... H10K 59/65
(Continued)

FOREIGN PATENT DOCUMENTS

| CN | 109037474 A | 12/2018 |
|---|---|---|
| CN | 109256040 A | 1/2019 |

(Continued)

OTHER PUBLICATIONS

First Office Action for the Chinese Patent Application No. 202010567967.3 issued by the Chinese Patent Office on Sep. 7, 2022.

*Primary Examiner* — Omar F Mojaddedi
(74) *Attorney, Agent, or Firm* — XSENSUS LLP

(57) ABSTRACT

A display panel has a pattern recognition region. The display panel includes a heat dissipation film, a connection portion, and a conductive portion. The heat dissipation film includes an adhesive layer, a heat conduction layer, and a conductive layer that are away from a display substrate in sequence. The
(Continued)

heat dissipation film further includes a pattern recognition hole penetrating the adhesive layer, the heat conduction layer, and the conductive layer. A surface of the connection portion away from the display substrate is exposed by the pattern recognition hole. The connection portion is included in the display substrate, or is located outside the display substrate. The conductive portion is disposed at least on a hole wall of the pattern recognition hole, and an end of the conductive portion is connected to the conductive layer, and another end of the conductive portion is connected to the connection portion.

20 Claims, 8 Drawing Sheets

(51) Int. Cl.
*H10K 59/131* (2023.01)
*H10K 59/65* (2023.01)
*H10K 71/00* (2023.01)

(52) U.S. Cl.
CPC ............... *G09G 2300/0426* (2013.01); *G09G 2300/0842* (2013.01)

(56) References Cited

U.S. PATENT DOCUMENTS

| | | | |
|---|---|---|---|
| 2019/0377925 A1* | 12/2019 | Bae | H01L 25/18 |
| 2020/0143134 A1* | 5/2020 | Wang | H04M 1/0266 |
| 2020/0350376 A1 | 11/2020 | Guo et al. | |
| 2021/0036069 A1* | 2/2021 | Ha | G06F 1/1637 |
| 2021/0089742 A1* | 3/2021 | Kim | H10K 59/65 |
| 2021/0327979 A1 | 10/2021 | Kamada et al. | |
| 2021/0365657 A1 | 11/2021 | Liu et al. | |
| 2021/0365658 A1 | 11/2021 | Cao et al. | |

FOREIGN PATENT DOCUMENTS

| | | |
|---|---|---|
| CN | 109427853 A | 3/2019 |
| CN | 109446941 A | 3/2019 |
| CN | 109543618 A | 3/2019 |
| CN | 110163044 A | 8/2019 |
| CN | 110580081 A | 12/2019 |
| CN | 111244115 A | 6/2020 |
| CN | 111725282 A | 9/2020 |
| KR | 10-2019-0123859 A | 11/2019 |
| WO | 2020053692 A1 | 3/2020 |

* cited by examiner

DISPLAY PANEL AND MANUFACTURING METHOD THEREFOR, AND DISPLAY DEVICE

CROSS-REFERENCE TO RELATED APPLICATIONS

The application is a national phase entry under 35 USC 371 of International Patent Application No. PCT/CN 2021/098934 filed on Jun. 8, 2021, which claims priority to Chinese Patent Application No. 202010567967.3, filed on Jun. 19, 2020, which are incorporated herein by reference in their entirety.

TECHNICAL FIELD

The present disclosure relates to the field of display technologies, and in particular, to a display panel and a manufacturing method therefor, and a display device.

BACKGROUND

With the rapid development of science and technology and the continuous progress of display technology, display devices with a high screen-to-body ratio are gradually favored by users. A full-screen display device is the ultimate development of a display device with a high screen-to-body ratio, and maximization of a screen-to-body ratio of a terminal is realized. Full-screen display device are deeply welcomed by users by virtue of good appearance, cool technological sense, wide visual field and comfortable hand feeling. A screen pattern recognition system is designed in the full-screen display device, so that the display device may be quickly awakened, thereby realizing human-computer interaction. The screen pattern recognition system may not be interfered by ambient light, and the user experience is good.

SUMMARY

In an aspect, a display panel is provided. The display panel has a pattern recognition region. The display panel includes a heat dissipation film, a connection portion and a conductive portion. The heat dissipation film is disposed on a non-light exit side of a display substrate of the display panel. The heat dissipation film includes an adhesive layer, a heat conduction layer and a conductive layer that are away from the display substrate in sequence. The heat dissipation film further includes a pattern recognition hole penetrating the adhesive layer, the heat conduction layer and the conductive layer. An orthogonal projection of the pattern recognition hole on the display substrate is at least partially overlapped with the pattern recognition region. The connection portion is located in the pattern recognition region. A surface of the connection portion away from the display substrate is exposed by the pattern recognition hole. The connection portion is included in the display substrate, or is located outside the display substrate. The conductive portion is disposed at least on a hole wall of the pattern recognition hole, and an end of the conductive portion is connected to the conductive layer, and another end of the conductive portion is connected to the connection portion.

In some embodiments, the display panel further includes a back film. The back film is disposed between the display substrate and the adhesive layer, and is configured to support the display substrate. A portion of the back film located in the pattern recognition region is the connection portion.

In some embodiments, a portion of the display substrate located in the pattern recognition region is the connection portion.

In some embodiments, the conductive portion includes a first sub-conductive portion, a second sub-conductive portion and a third sub-conductive portion. The first sub-conductive portion is located on a side of the conductive layer away from the connection portion, and is electrically connected to the conductive layer and the second sub-conductive portion. The second sub-conductive portion is located on the hole wall of the pattern recognition hole, and is electrically connected to the third sub-conductive portion. The third sub-conductive portion is located on the surface of the connection portion away from the display substrate, and is in contact with the connection portion.

In some embodiments, in a direction parallel to the display substrate, a width of the first sub-conductive portion is zero. An end of the second sub-conductive portion away from the connection portion is flush with a surface of the conductive layer away from the connection portion, and is electrically connected to the conductive layer.

In some embodiments, in a direction parallel to the display substrate, a width of the third sub-conductive portion is zero. An end of the second sub-conductive portion proximate to the display substrate is in contact with the connection portion.

In some embodiments, in a direction parallel to the display substrate, a width of the first sub-conductive portion and a width of the third sub-conductive portion are zero. An end of the second sub-conductive portion proximate to the display substrate is in contact with the connection portion. An end of the second sub-conductive portion away from the connection portion is flush with a surface of the conductive layer away from the connection portion, and is electrically connected to the conductive layer.

In some embodiments, the second sub-conductive portion occupies the entire hole wall of the pattern recognition hole.

In some embodiments, a sectional shape of the second sub-conductive portion taken along a direction perpendicular to the display substrate is one of a rectangle, a trapezoid or a triangle.

In some embodiments, at least one of the first sub-conductive portion, the second sub-conductive portion and the third sub-conductive portion is a film layer with a uniform thickness.

In some embodiments, the display panel further includes a sensor. The sensor is configured to receive light reflected by a pattern of a contact object and form a pattern recognition image according to the reflected light.

In some embodiments, an area of the orthogonal projection of the pattern recognition hole on the display substrate is a first area, an area of an orthographic projection of the second sub-conductive portion on the display substrate is a second area, and an area of an orthographic projection of the third sub-conductive portion on the display substrate is a third area. A sum of the second area and the third area is a fourth area, and a difference between the first area and the fourth area is greater than an installation area of the sensor.

In some embodiments, a material of the conductive portion includes conductive ink.

In some embodiments, the conductive ink is conductive silver paste.

In some embodiments, the conductive portion is manufactured by a screen printing equipment.

In another aspect, a display device is provided. The display device includes the display panel in any of the above embodiments.

In yet another aspect, a manufacturing method of a display panel is provided. The manufacturing method includes: manufacturing a display substrate, the display substrate having a pattern recognition region; forming a heat dissipation film on a non-light exit side of the display substrate, the heat dissipation film including an adhesive layer, a heat conduction layer and a conductive layer that are away from the display substrate in sequence; forming a pattern recognition hole in the heat dissipation film, the pattern recognition hole penetrating the adhesive layer, the heat conduction layer and the conductive layer, and an orthogonal projection of the pattern recognition hole on the display substrate being at least partially overlapped with the pattern recognition region; and forming a conductive portion, the conductive portion being disposed at least on a hole wall of the pattern recognition hole, and an end of the conductive portion being connected to the conductive layer, and another end of the conductive portion being connected to a portion of the display substrate exposed by the pattern recognition hole.

In some embodiments, after the display substrate is manufactured, and before the heat dissipation film is formed on the non-light exit side of the display substrate, the manufacturing method further includes: forming a back film on the non-light exit side of the display substrate. The end of the conductive portion is connected to the conductive layer, and the another end of the conductive portion is connected to a portion of the back film exposed by the pattern recognition hole.

In some embodiments, forming the conductive portion includes: placing the display panel on a stamp pad of a screen printing equipment, a light exit surface of the display panel being close to the stamp pad; aligning an opening region of a screen of the screen printing equipment with the pattern recognition hole, so that an orthogonal projection region of the opening region on the display panel is overlapped with a region of the pattern recognition hole where the conductive portion needs to be manufactured; coating conductive ink on the screen; and curing the conductive ink to form the conductive portion.

In some embodiments, after the conductive portion is formed, the manufacturing method further includes: installing a sensor in the pattern recognition hole.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
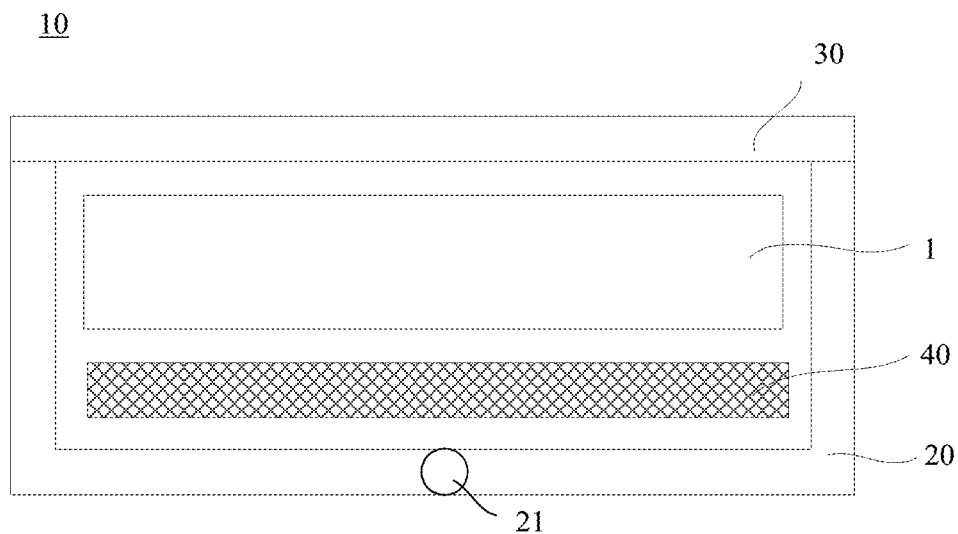
FIG. 1 is a structural diagram of a display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features.

In the description of the embodiments of the present disclosure, the term "a plurality of/the plurality of" means two or more unless otherwise specified.

In the description of some embodiments, the terms such as "coupled" and "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display device. The display device may be a mobile phone, a tablet computer, a notebook, a personal digital assistant (PDA), or a vehicle-mounted computer.

A type of the display device is not limited in the embodiments of the present disclosure. For example, the display device may be an organic light-emitting diode (OLED) display device, or a quantum dot light-emitting diode (QLED) display device. The OLED display device has advantages of lightness and thinness, high luminous efficiency, being foldable and rollable, low power consumption and fast response. Hereinafter, a description will be made in an example where the display device is the OLED display device.

As shown in FIG. 1, the display device 10 includes a frame 20, a cover plate 30, a display panel 1, a circuit board 40 and other electronic accessories. A longitudinal section of the frame 20 is U-shaped. The display panel 1, the circuit board 40 and other electronic accessories are all disposed in the frame 20. The circuit board 40 is disposed behind the display panel 1. The cover plate 30 is disposed on a side of the display panel 1 away from the circuit board 40.

The cover plate 30 may be rigid or flexible. A constituent material of the rigid cover plate 30 may be glass. A constituent material of the flexible cover plate 30 may be polyimide (PI). In this case, the frame 20 may be a foldable frame. As shown in FIG. 1, the foldable frame 20 includes a rotation shaft 21, so that the display device 10 may be folded along the rotation shaft 21.

Figure 2:
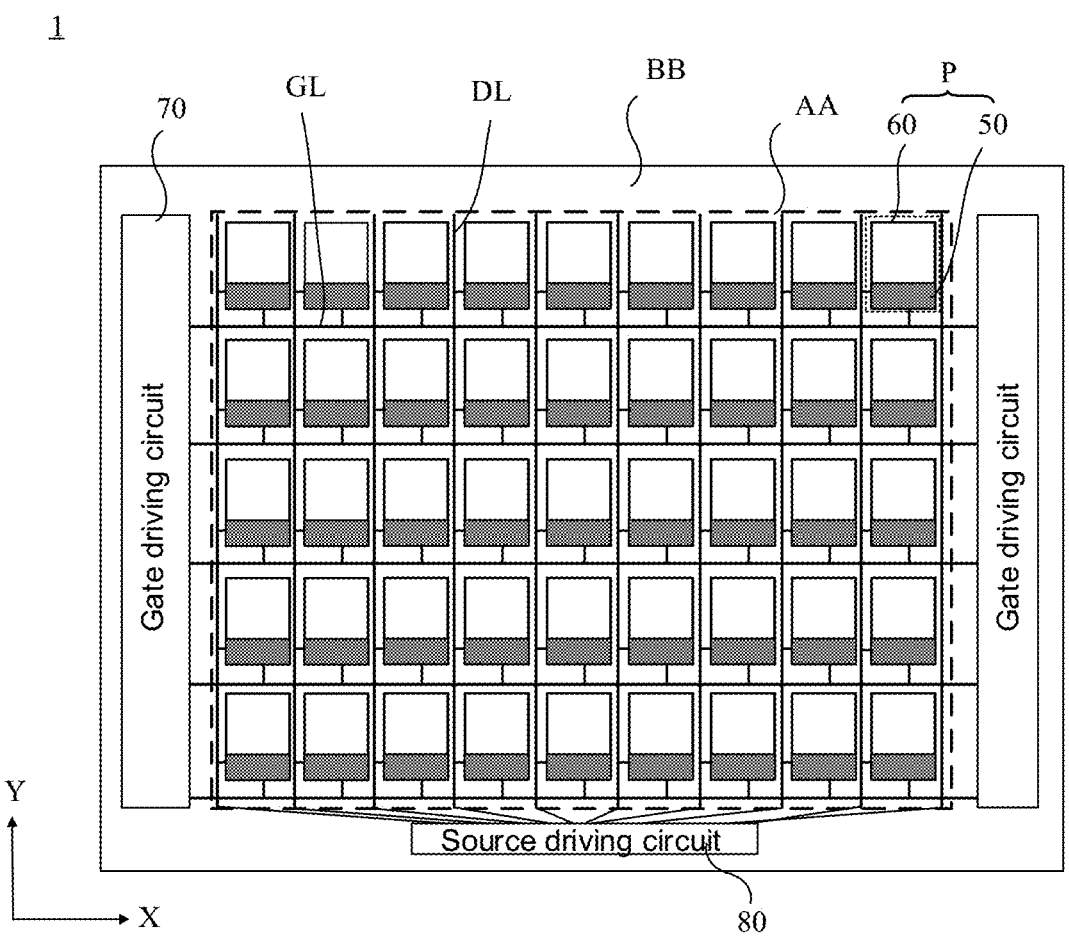
FIG. 2 is a plan view of a display panel, in accordance with some embodiments.

As shown in FIG. 2, when viewing from a display surface of the display panel 1, it can be seen that the display panel 1 has a display area (also referred to as active area) AA and a peripheral area BB located on at least one side of the display area AA. FIG. 2 exemplarily illustrates that the peripheral area BB surrounds the display area AA, but is not limited thereto.

The display area AA may include a plurality of sub-pixels P. For the convenience of description, as an example, the plurality of sub-pixels P are arranged in a matrix form. Moreover, sub pixels P arranged in a line in a horizontal direction X are referred to as a same row of sub pixels, and sub pixels P arranged in a line in a vertical direction Y are referred to as a same column of sub pixels.

As shown in FIG. 2, each sub-pixel P includes a pixel circuit 50 and a light-emitting device 60 electrically connected to the pixel circuit 50. The pixel circuit 50 is capable of driving the light-emitting device 60 electrically connected thereto to emit light. In this case, light-emitting devices 60 in the plurality of sub-pixels P may emit at least three primary colors of light, such as red (R) light, green (G) light and blue (B) light.

The peripheral area BB in FIG. 2 includes a source driving circuit 80, a plurality of signal leads, and gate driving circuit(s) 70 each located on a side of the display area AA. The plurality of sub-pixels P in the display area AA are connected to the gate driving circuit(s) and the source driving circuit through the plurality of signal leads. FIG. 2 exemplarily illustrates that the gate driving circuits 70 are respectively located on left and right sides of the display area AA. In some embodiments, the gate driving circuit(s) 70 may be disposed in the peripheral area BB by using a gate driver on array (GOA) technology, so as to reduce a size of the peripheral area BB to realize a narrow bezel of the display device.

The display panel 1 includes a display substrate 100. Since structures corresponding to respective sub-pixels P in the display panel 1 are basically repeated, an internal structure of the display panel 100 will be described with reference to in FIGS. 3 and 4 in an example where a partial structure corresponding to a sub-pixel P in FIG. 2.

Figure 3:
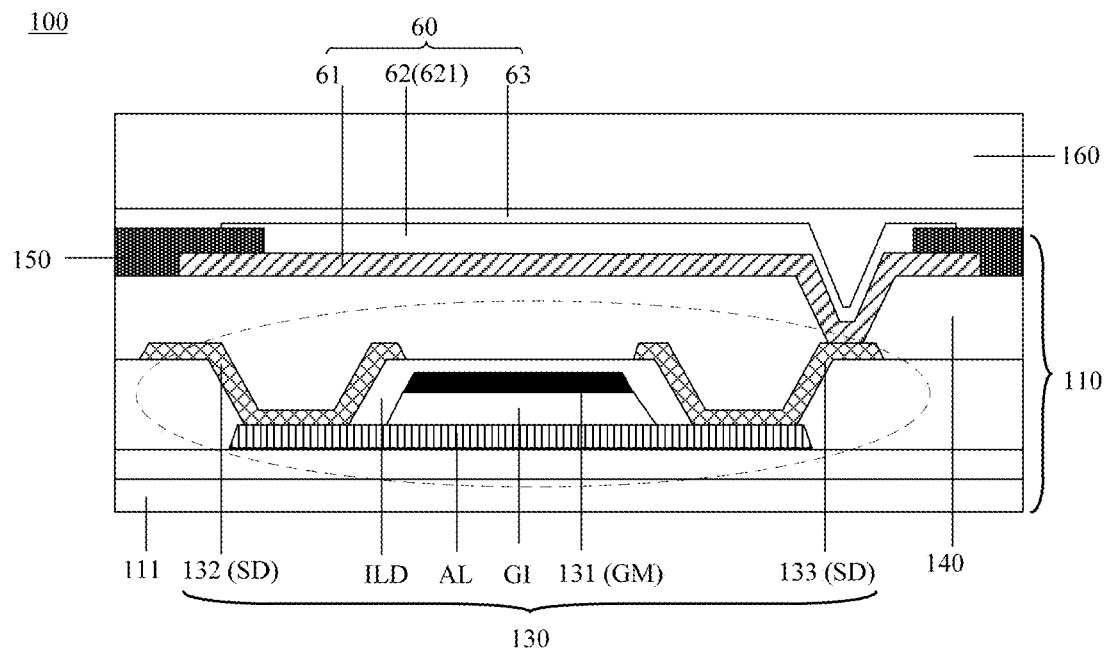
FIG. 3 is a structural diagram of a display substrate, in accordance with some embodiments.
Figure 4:
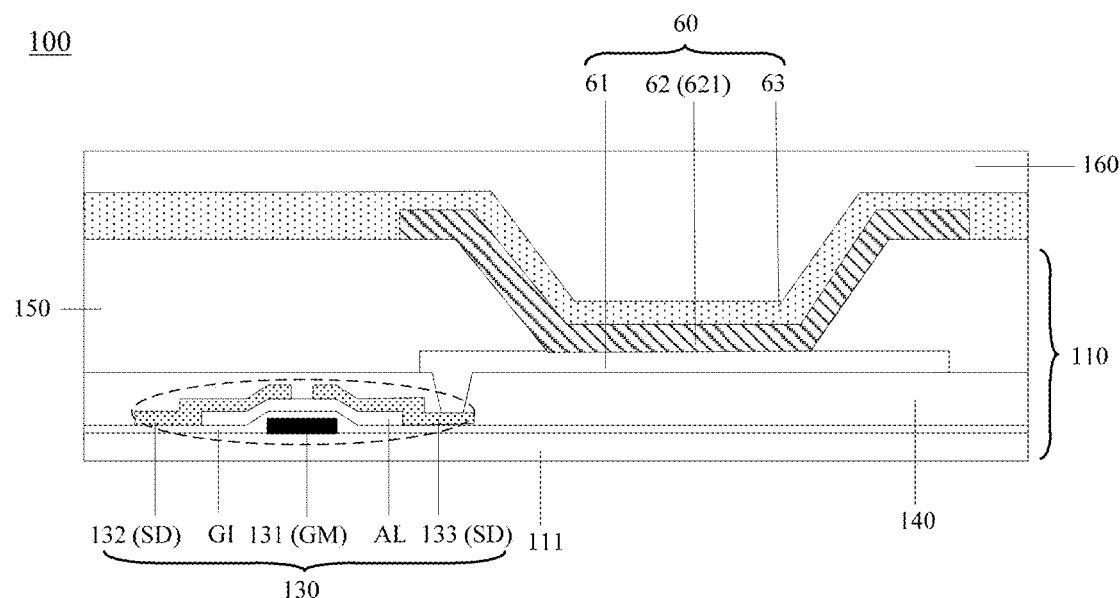
FIG. 4 is a structural diagram of another display substrate, in accordance with some embodiments.

As shown in FIGS. 3 and 4, the display substrate 100 includes an array substrate 110 having a plurality of pattern layers that are stacked, the light-emitting devices 60 and an encapsulation layer 160. The encapsulation layer 160 is used for preventing water vapor and oxygen from entering the array substrate 110 and the light-emitting devices 60, so as to avoid poor display.

The array substrate 110 includes a base substrate 111 and pixel circuits 50 in the plurality of sub-pixels P that are disposed on the base substrate 111.

The base substrate 111 may be a flexible base substrate or a rigid base substrate. A constituent material of the flexible base substrate 111 may include one or more of polyimide (PI), polyethylene terephthalate (PET), polyethylene naphthalate two formic acid glycol ester (PEN). A constituent material of the rigid base substrate 111 may be, for example, glass.

The array substrate 110 further includes gate lines GL arranged in a direction, data lines DL insulated from the gate lines GL and a common power line that are all disposed on the base substrate 111, and the data lines DL and the gate lines GL cross. The common power line is generally parallel to the data lines DL. The plurality of sub-pixels P may be defined by the gate lines GL and data lines DL (and the common power line) that are arranged in a crossed manner (as shown in FIG. 2). The pixel circuit 50 is electrically connected to the gate driving circuit 70 through a gate line GL, so as to receive a gate driving signal transmitted from the gate driving circuit 70. The pixel circuit 50 is further electrically connected to the source driving circuit 80 through a data line DL, so as to receive a data signal transmitted from the source driving circuit 80.

The pixel circuit 50 includes at least two thin film transistors (TFT) 130 and at least one capacitor (not shown in FIG. 3). Each thin film transistor 130 may adopt a top-gate structure or a bottom-gate structure. As shown in FIG. 3, in a case where the thin film transistor 130 has the top-gate structure, the array substrate 110 includes an active layer AL, a gate insulating layer GI, a gate metal pattern layer GM (for forming gates 131 of thin film transistors 130 in the pixel circuits 50), an interlayer dielectric layer ILD and a source-drain metal pattern layer SD (for forming sources 132 and drains 133 of the thin film transistors 130 in the pixel circuits 50) that are all disposed on the base substrate 111. In some other embodiments, as shown in FIG. 4, in a case where the thin film transistor 130 has the bottom-gate structure, the array substrate 110 includes a gate metal pattern layer GM (for forming gates 131 of the thin film transistors 130 in the pixel circuits 50), a gate insulating layer GI, an active layer AL and a source-drain metal pattern layer SD (for forming sources 132 and drains 133 of the thin film transistors 130 in the pixel circuits 50) that are all disposed on the base substrate 111.

A type of the thin film transistor 130 varies. For example, the thin film transistor 130 may be an N-type thin film transistor or a P-type thin film transistor, and the N-type thin film transistor and the P-type thin film transistor are different only in conduction condition. The N-type thin film transistor is turned on at a high level, and is turned off at a low level. The P-type thin film transistor is turned on at a low level, and is turned off at a high level. The active layer AL may be composed of amorphous silicon, monocrystalline silicon, polycrystalline silicon, or an oxide semiconductor. The active layer AL includes a channel region not doped with an impurity, and a source region and a drain region formed by doping an impurity on two sides of the channel region. The doped impurity varies with the type of the thin film transistor 130, and may be an N-type impurity or a P-type impurity.

The capacitor includes a first electrode plate and a second electrode plate with an interlayer insulating film as a dielectric therebetween.

Figure 5:
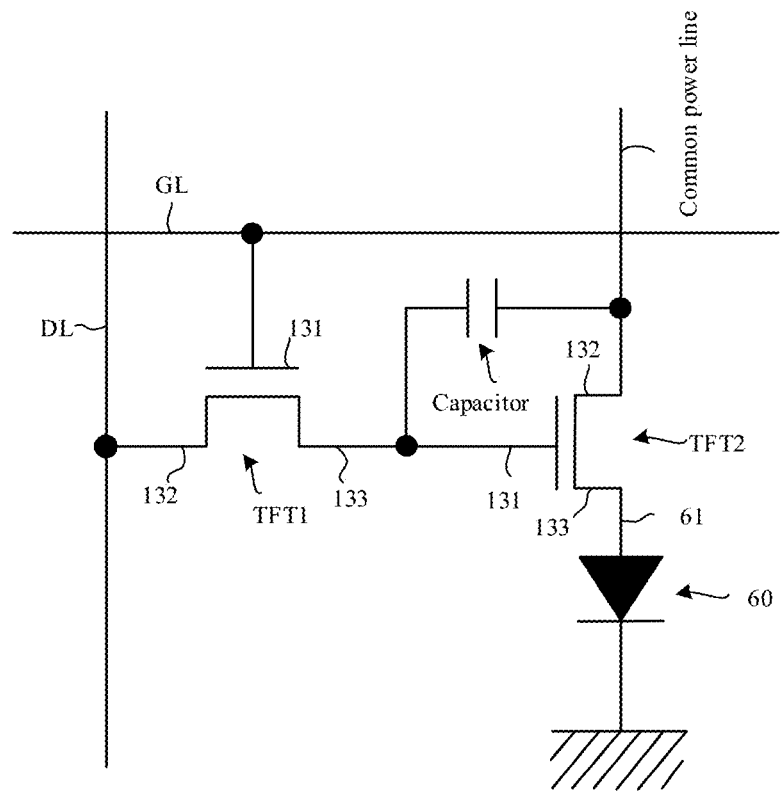
FIG. 5 is an equivalent circuit diagram of a pixel circuit, in accordance with some embodiments.

FIG. 5 illustrates an electrical connection relationship between the inside and outside of the pixel circuit by taking a 2T1C structure as an example, and in the 2T1C structure, the pixel circuit 50 includes two thin film transistors 130 (i.e., a switching thin film transistor TFT1 and a driving thin film transistor TFT2) and a capacitor. FIG. 3 or 4 only shows a structure of the driving thin film transistor (i.e., a structure as shown in a dotted circle in FIG. 3 or 4) and a structure of the light-emitting device 60, and a connection relationship between the driving thin film transistor and the light-emitting device 60. However, a structure of the switching thin film transistor and connection relationships between the switching thin film transistor and other components may be completely determined by those skilled in the art according to the context.

As shown in FIG. 5, a gate 131 of the switching thin film transistor TFT1 is connected to a gate line GL, a source 132 of the switching thin film transistor TFT1 is connected to a data line DL, and a drain 133 of the switching thin film transistor TFT1 is to connected to a gate 131 of the driving thin film transistor TFT2. A source 132 of the driving thin film transistor TFT2 is connected to the common power line, and a drain 133 of the driving thin film transistor TFT2 is connected to a first electrode 61 of the light-emitting device 60 through a via. The first electrode plate of the capacitor is connected to the gate 131 of the driving thin film transistor TFT2, and the second electrode plate of the capacitor is connected to the source 132 of the driving thin film transistor TFT2.

The switching thin film transistor TFT1 is turned on by a gate voltage applied to the gate line GL, thereby transmitting a data voltage applied to the data line DL to the driving thin film transistor TFT2. There is a certain difference between the data voltage transmitted from the switching thin film transistor TFT1 to the driving thin film transistor TFT2 and a common voltage applied from the common power line to the driving thin film transistor TFT2, and a voltage corresponding to an absolute value of the difference is stored in the capacitor. Therefore, a current corresponding to the voltage stored in the capacitor flows into the light-emitting device 60 through the driving thin film transistor TFT2, so that the light-emitting device 60 emits light.

In addition, as shown in FIGS. 3 and 4, the light-emitting device 60 includes the first electrode 61, a light-emitting functional layer 62 and a second electrode 63 that are arranged on the array substrate 110 in sequence. One of the first electrode 61 and the second electrode 63 is an anode (for providing holes), and another one of the first electrode 61 and the second electrode 63 is a cathode (for providing electrons). The first electrode 61 and the second electrode 63 inject the holes and the electrons into the light-emitting functional layer 62, and the light-emitting functional layer 62 emits light when excitons generated by combination of the holes and the electrons transition from an excited state to a ground state.

The first electrode 61 may be formed of a metal with a high reflectivity, and the second electrode 63 may be formed of a transparent conductive film. In this case, light emitted from the light-emitting functional layer 62 is reflected by the first electrode 61, and exits through the second electrode 63, and thus a top emission light-emitting device is formed, but is not limited thereto. In a case where the first electrode 61 is formed of a transparent conductive film, and the second electrode 63 is formed of a metal with a high reflectivity, a bottom emission light-emitting device may be formed. Of course, in a case where the first electrode 61 and the second electrode 63 are each formed of a transparent conductive film, a double-sided emission light-emitting device may be formed.

For example, the transparent conductive film may be made of a metal oxide such as an indium tin oxide (ITO), an indium zinc oxide (IZO) or an indium gallium zinc oxide (IGZO). For example, the metal with a high reflectivity may be an alloy such as magnesium aluminum alloy (MgAl) or lithium aluminum alloy (LiAl), or an elemental metal such as magnesium (Mg), aluminum (Al), lithium (Li), or silver (Ag). In addition, these metal materials further have characteristics of high conductivity and low work function. The light-emitting device 60 shown in FIG. 3 is a top emission light-emitting device, and the first electrode 61 is formed of the metal with a high reflectivity, and the second electrode 63 is formed of the transparent metal oxide.

In some embodiments, as shown in FIGS. 3 and 4, the light-emitting functional layer 62 may include a light-emitting layer 621. In some other embodiments, in addition to the light-emitting layer 621, the light-emitting functional layer 62 may further include at least one of a hole injection layer (HI L), a hole transport layer (HTL), an electron transport layer (ETL) and an electron injection layer (EIL) (not shown in FIG. 3). In a case where the light-emitting functional layer 62 includes all of the above layers, the hole injection layer, the hole transport layer, the light-emitting layer 621, the electron transport layer and the electron injection layer are stacked on the first electrode 61 as an anode in sequence.

As shown in FIG. 3, the array substrate 110 may further include a planarization layer 140 disposed between the thin film transistors 130 in the pixel circuits 50 and first electrodes 61 of the light-emitting devices 60 in the plurality of sub-pixels P, and a pixel defining layer 150 disposed on a side of the planarization layer 140 away from the base substrate 111. The pixel defining layer 150 includes a plurality of opening regions and dams each arranged around an opening region. A light-emitting device 60 is disposed in an opening region. A first electrode 61 and a light-emitting layer 621 of a light-emitting device 60 are separated from a first electrode 61 and a light-emitting layer 621 of an adjacent light-emitting device 60 by a dam of the pixel defining layer 150. Second electrodes 63 of the light-emitting devices 60 are connected as a whole. That is, the second electrodes 63 are a whole layer. In light-emitting functional layers 62 of the light-emitting devices 60, hole injection layers may be separated from each other by the dams of the pixel defining layer 150 or be a whole layer, hole transport layers may be separated from each other by the dams of the pixel defining layer 150 or be a whole layer, electron transport layers may be separated from each other by the dams of the pixel defining layer 150 or be a whole layer, and electron injection layers may be separated from each other by the dams of the pixel defining layer 150 or be a whole layer. The pixel defining layer 150 may be made of, for example, black polyimide, which is capable of absorbing light emitted from a light-emitting device 60 toward another adjacent light-emitting device 60, so as to avoid light mixing between two adjacent sub-pixels.

The encapsulation layer 160 may include encapsulation film(s). The number of the encapsulation film(s) included in the encapsulation layer 160 is not limited. In some embodiments, the encapsulation layer 160 may include an encapsulation film, or two or more encapsulation films that are stacked. For example, the encapsulation layer 160 includes three encapsulation films that are stacked in sequence.

In a case where the encapsulation layer 160 includes the three encapsulation films that are stacked in sequence, an encapsulation film located in the middle is made of an organic material, and encapsulation films respectively located on two sides are each made of an inorganic material. The organic material may be, for example, polymethyl methacrylate (PMMA). The inorganic material may include one or more of silicon nitride ($SiN_x$), silicon oxide ($SiO_x$) or silicon oxynitride ($SiO_xN_y$).

When the display device 10 is used, it is desirable to wake up and unlock the screen quickly. In order to wake up and unlock the screen quickly, a pattern recognition system may be provided in the display panel 1. The principle of the pattern recognition system is as follows. When a contact object (e.g., a finger) touches the display panel 1, light emitted from the display panel 1 passes through the cover plate 30 to illuminate the pattern of the contact object. The pattern of the contact object reflects part of the light, and the reflected light passes through the display panel 1 and returns to a sensor in the pattern recognition system. Finally, a pattern recognition image is formed through the sensor, thereby recognizing the pattern of the contact object. If the pattern recognition result is passed, the screen may be unlocked. The pattern recognition system will be described in detail below. Hereinafter, the structure of the display substrate 100 in the display panel 1 is not drawn to simplify the drawings.

Figure 6:
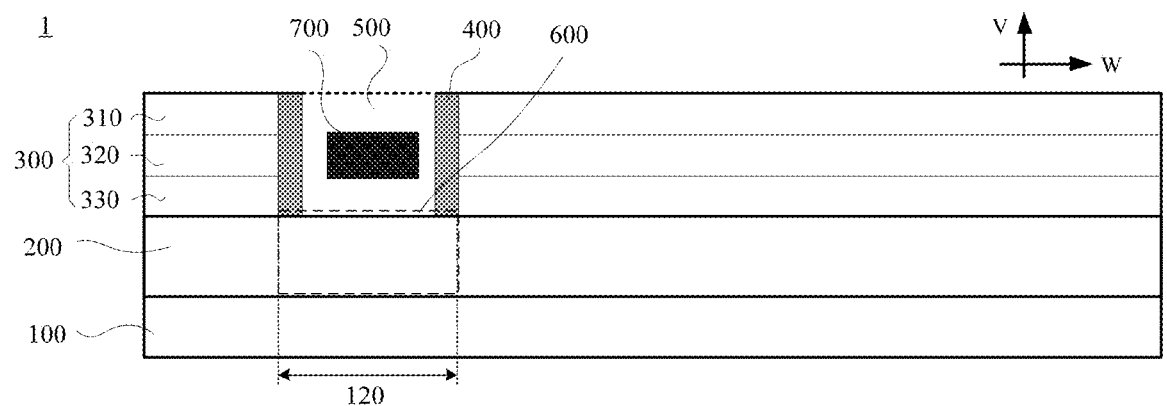
FIG. 6 is a structural diagram of a display panel, in accordance with some embodiments.

As shown in FIG. 6, the display panel 1 further includes a back film 200 disposed on a non-light exit side of the display substrate 100, and a heat dissipation film 300 disposed on a side of the back film 200 away from the display substrate 100.

The back film 200 is located on the non-light exit side of the display substrate 100, which is capable of supporting the display substrate 100. The back film 200 may be adhered to the display substrate 100 through an adhesive layer. The back film 200 may be a transparent film layer made of one or more of polyimide (PI), polyethylene terephthalate (PET), polymethyl methacrylate (PMMA). A constituent material of the adhesive layer is ultraviolet (UV) curing adhesive or photoresist.

Figure 7:
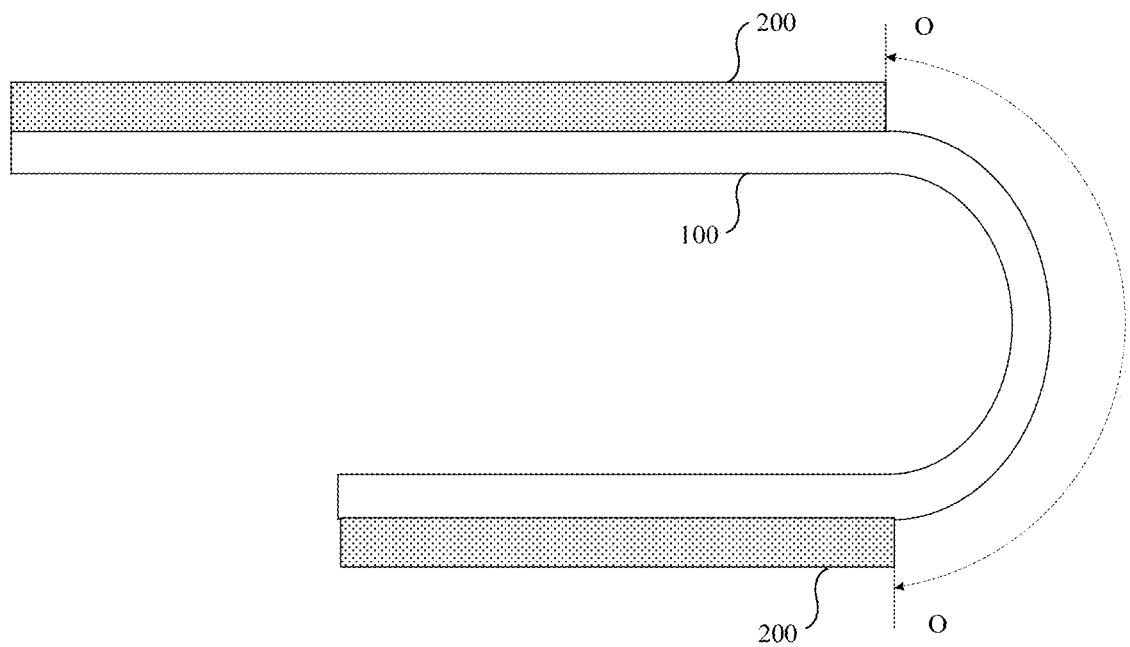
FIG. 7 is a structural diagram of another display panel, in accordance with some embodiments.

In some embodiments, as shown in FIG. 7, in a case where the display substrate 100 needs to be bent in a bending region OO of the peripheral area BB to realize the narrow bezel, a portion of the back film 200 in the display substrate 100 at the bending region OO may be removed, so that the back film 200 forms a U-shaped opening at the bending region OO. The back film 200 with this structure is generally referred to as a U-shaped film (also called U-film).

In some embodiments, the display panel 1 may not include the back film 200, and in this case, the base substrate 111 is the rigid base substrate.

The heat dissipation film 300 may provide shading, buffering, heat dissipation and shielding for the display substrate 100. As shown in FIG. 6, the heat dissipation film 300 includes an adhesive layer 330, a heat conduction layer 320 and a conductive layer 310 that are away from the back film 200 in sequence. The conductive layer 310 is used for grounding. The adhesive layer 330 is used for fixedly connecting the heat dissipation film 300 to a side of the back film 200 away from the display substrate 100, and further has a light-shielding function. In a case where the display panel 1 does not include the back film 200, the adhesive layer 330 is used for fixedly connecting the heat dissipation film 300 to the non-light exit side of the display substrate 100. The heat conduction layer 320 is located between the adhesive layer 330 and the conductive layer 310 for conducting heat generated by the display substrate 100 to the conductive layer 310.

Constituent materials of the conductive layer 310, the heat conduction layer 320 and the adhesive layer 330 in the heat dissipation film 300 are not limited in the embodiments of the present disclosure. For example, the conductive layer 310 may be a copper layer, a stainless steel (also referred to as steel use stainless, SUS) layer or an aluminum alloy layer. The heat conduction layer 320 may be made of heat conduction graphite or foam. The adhesive layer 330 is a black adhesive layer for absorbing light or a white adhesive layer with a reflective property.

As shown in FIG. 6, the heat dissipation film 300 includes a pattern recognition hole 500. The display panel 1 has a pattern recognition region 120. The pattern recognition hole 500 is located in the pattern recognition region 120, and exposes a connection portion 600 of the pattern recognition region 120. In some embodiments, in the case where the display panel 1 includes the back film 200, as shown in FIG. 6, the connection portion 600 exposed by the pattern recognition hole 500 is a portion of the back film 200. In some embodiments, in the case where the display panel 1 does not include the back film 200, the connection portion 600 exposed by the pattern recognition hole 500 is a portion of the display substrate 100. Hereinafter, a description will be made in an example where the display panel 1 includes the back film 200. In this case, the connection portion 600 is the portion of the back film 200 located in the pattern recognition region 120. It can be seen from the above that the back film 200 is a transparent film layer, and the transparent back film 200 does not affect a light transmission effect of the pattern recognition hole 500, thereby improving an accuracy of the pattern recognition.

The pattern recognition hole 500 is located in the pattern recognition region 120, which means that an orthogonal projection of the pattern recognition hole 500 on the display substrate 100 is at least partially overlapped with the pattern recognition region 120. For example, the orthogonal projection of the pattern recognition hole 500 on the display substrate 100 is completely or partially overlapped with the pattern recognition region 120. The orthogonal projection of the pattern recognition hole 500 on the display substrate 100 is partially overlapped with the pattern recognition region 120, which may be that, for example, the orthogonal projection of the pattern recognition hole 500 on the display substrate 100 completely covers the pattern recognition region 120, and is greater than the pattern recognition region 120 in size; or the pattern recognition region 120 completely covers the orthogonal projection of the pattern recognition hole 500 on the display substrate 100, and is greater than the orthogonal projection of the pattern recognition hole 500 on the display substrate 100 in size; or one of the orthogonal projection of the pattern recognition hole 500 on the display substrate 100 and the pattern recognition region 120 does not completely cover another one of the orthogonal projection of the pattern recognition hole 500 on the display substrate 100 and the pattern recognition region 120.

As shown in FIG. 6, the display panel 1 further includes the sensor 700 located in the pattern recognition hole 500. The sensor 700 is configured to receive the light reflected by the pattern of the contact object, form the pattern recognition image according to the reflected light, and transmit the pattern recognition image to a processor of the display device 10. The processor compares the pattern recognition image detected by the sensor 700 with a pattern image pre-stored by a user. If the comparison is successful, the user is allowed to unlock the screen. The foregoing pattern recognition system includes at least the pattern recognition hole 500 and the sensor 700 located in the pattern recognition hole 500.

As shown in FIG. 6, the display panel 1 further includes a conductive portion 400. The conductive portion 400 is disposed at least on a hole wall of the pattern recognition hole 500. An end of the conductive portion 400 is connected to the conductive layer 310, and another end of the conductive portion 400 is connected to the connection portion 600, so that the conductive layer 310 is connected to the exposed portion of the back film 200.

A constituent material of the conductive portion 400 is not limited in the embodiments of the present disclosure. For example, the material of the conductive portion 400 includes a conductive ink. The conductive ink is a pasty ink prepared by dispersing a conductive material (e.g., gold, silver, copper or carbon) in a binder, and is commonly known as a paste ink. The conductive ink has a certain degree of conductive property, and may be used as a conductive point or a conductive line. According to different conductive materials, the conductive ink may be classified into a gold-based conductive ink, a silver-based conductive ink, a copper-based conductive ink, or a carbon-based conductive ink. The conductive ink in some embodiments of the present disclosure may be the silver-based conductive ink, such as a conductive silver paste.

When the contact object, such as a finger or palm, approaches the pattern recognition region 120 of the display panel 1, an induced electric field is generated on a surface of the back film 200 away from the display substrate 100. Since the portion of the back film 200 located in the pattern recognition region 120 is non-covered by the heat dissipation film 300, a surface impedance of the back film 200 in this region is very large (about 2 megohms), so that induced charges in the pattern recognition region 120 cannot be released, but are accumulated. However, in other region except the pattern recognition region 120, a portion of the back film 200 is covered by the heat dissipation film 300. Since the heat dissipation film 300 has the conductive layer 310 (e.g., the copper layer), and the induced charges may be effectively conducted away, the region covered with the heat dissipation film 300 has a smaller amount of induced charges. Therefore, an amount of induced charges at the portion of the back film 200 located in the pattern recognition region 120 is different from an amount of induced charges at the portion of the back film 200 covered by the heat dissipation film 300, and thus, the properties of the thin film transistors 130 in the display substrate 100 are affected, which causes a brightness of the pattern recognition region 120 to be lower than a brightness of the other region in the display panel 1, resulting in shadows in the pattern recognition region 120.

However, the conductive portion 400 is disposed at least on the hole wall of the pattern recognition hole 500, and the conductive layer 310 of the heat dissipation film 300 is connected to the portion of the back film 200 exposed by the pattern recognition hole 500 by using the conductive portion 400, so that the induced charges accumulated at the portion of the back film 200 located in the pattern recognition region 120 are conducted away through the conductive layer 310 of the heat dissipation film 300. Therefore, a difference between the amount of induced charges accumulated at the portion of the back film 200 located in the pattern recognition region 120 and the amount of induced charges accumulated at the portion of the back film 200 located in the other region is reduced, and thus, the problem of display shadows due to the uneven distribution of the induced charges is solved. Moreover, the conductive portion 400 is substantially arranged on the hole wall of the pattern recognition hole 500, which does not affect a normal acquisition of the pattern recognition image.

Figure 8:
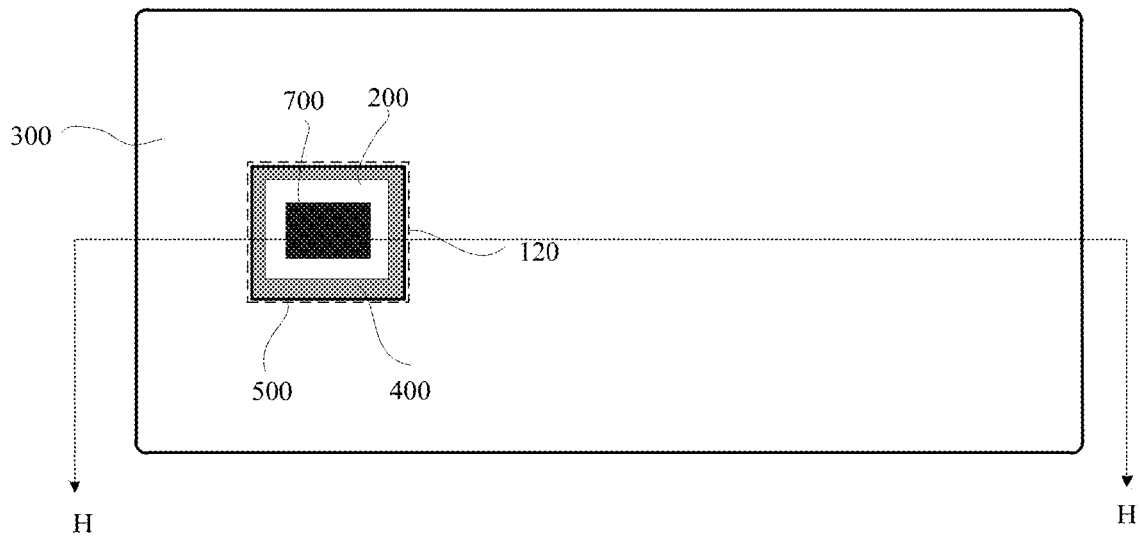
FIG. 8 is a top view of a display panel, in accordance with some embodiments.

The conductive portion 400 is disposed at least on the hole wall of the pattern recognition hole 500. It will be understood that the conductive portion 400 is disposed on the hole wall of the pattern recognition hole 500, or the conductive portion 400 is disposed on the hole wall of the pattern recognition hole 500 and in a region close to the hole wall. The region close to the hole wall may be a region above the portion of the back film 200 exposed by the pattern recognition hole 500, or a region adjacent to the pattern recognition hole 500 above the conductive layer 310 of the heat dissipation film 300. Since a conduction rate of charges is affected by a magnitude of an area of the conductive portion 400, in some embodiments of the present disclosure, as shown in FIG. 8, the conductive portion 400 occupies the entire hole wall of the pattern recognition hole 500. In this case, a sectional view of the display panel 1 in FIG. 8 taken along the H-H direction is as shown in FIG. 6.

The conductive portion 400 occupies the entire hole wall of the pattern recognition hole 500, which is equivalent to that the entire hole wall of the pattern recognition hole 500 is covered by the conductive portion 400, so that an conductive area of the conductive portion 400 is increased, which is conducive to improving the conduction rate of the charges, and accelerating the transfer of the induced charges at the portion of the back film 200 located in the pattern recognition region 120, so as to avoid the display shadows caused by a large number of induced charges accumulated at the portion of the back film 200 located in the pattern recognition region 120.

Figure 9:
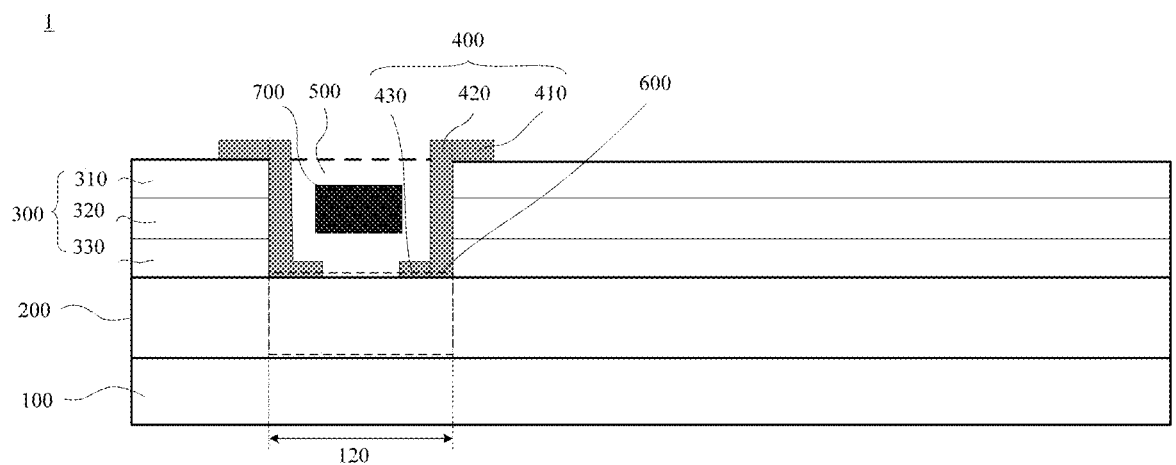
FIG. 9 is a structural diagram of yet another display panel, in accordance with some embodiments.

In some embodiments, as shown in FIG. 9, the conductive portion 400 includes a first sub-conductive portion 410, a second sub-conductive portion 420, and a third sub-conductive portion 430. The first sub-conductive portion 410 is located on a side of the conductive layer 310 away from the back film 200, and is electrically connected to the conductive layer 310 and the second sub-conductive portion 420. The second sub-conductive portion 420 is located on the hole wall of the pattern recognition hole 500, and is electrically connected to the third sub-conductive portion 430. The third sub-conductive portion 430 is located on the side of the back film 200 away from the display substrate 100, and is in contact with the back film 200.

The first sub-conductive portion 410 is used for electrically connecting the conductive layer 310 and the second sub-conductive portion 420, and the third sub-conductive part 430 is used for electrically connecting the back film 200 and the second sub-conductive portion 420. As a connection portion between the first sub-conductive portion 410 and the third sub-conductive portion 430, the second sub-conductive portion 420 is disposed on the hole wall of the pattern recognition hole 500. The first sub-conductive portion 410, the second sub-conductive portion 420 and the third sub-conductive portion 430 are connected in sequence to form the entire conductive portion 400, so that the stability of the conductive connection between the conductive layer 310 and the back film 200 may be improved.

Figure 10:
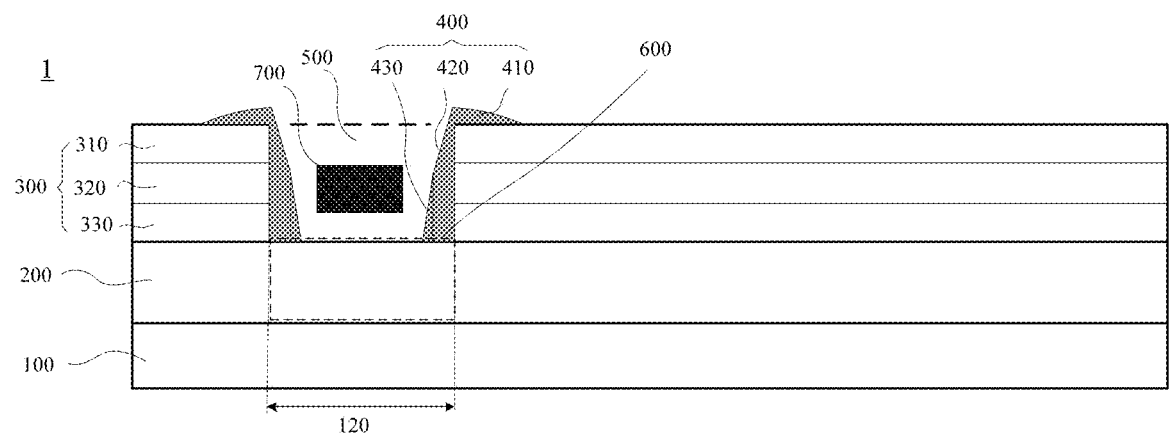
FIG. 10 is a structural diagram of yet another display panel, in accordance with some embodiments.

The first sub-conductive portion 410, the second sub-conductive portion 420 and the third sub-conductive portion 430 in FIG. 9 are each of a film layer structure with a uniform thickness, which may ensure the uniformity of charge transmission. Moreover, the first sub-conductive portion 410, the second sub-conductive portion 420 and the third sub-conductive portion 430 are easy to be manufactured, which is conducive to improving the process efficiency. In some other embodiments, as shown in FIG. 10, part or all of the first sub-conductive portion 410, the second sub-conductive portion 420 and the third sub-conductive portion 430 each may be of a film layer structure with a non-uniform thickness, as long as the conductive portion 400 formed by connecting the first sub-conductive portion 410, the second sub-conductive portion 420 and the third sub-conductive portion 430 is capable of connecting the exposed portion of the back film 200 to the conductive layer 310 of the heat dissipation film 300 to form a conductive path.

Figure 11:
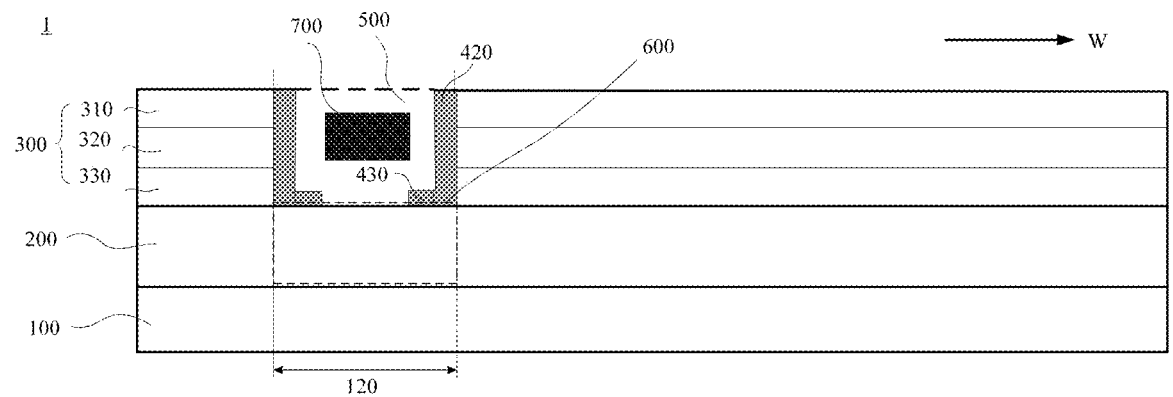
FIG. 11 is a structural diagram of yet another display panel, in accordance with some embodiments.

In some embodiments, as shown in FIG. 11, considering a flatness of an outermost surface of the display panel 1, a width of the first sub-conductive portion 410 is zero in a direction (i.e., the W direction in FIG. 11) parallel to the display substrate 100. Moreover, an end of the second sub-conductive portion 420 away from the back film 200 is flush with a surface of the conductive layer 310 away from the back film 200.

The width of the first sub-conductive portion 410 in the direction parallel to the display substrate 100 is zero. That is, the conductive portion 400 is not disposed on the surface of the conductive layer 310 away from the back film 200. Moreover, the end of the second sub-conductive portion 420 away from the back film 200 is flush with the surface of the conductive layer 310 away from the back film 200, so that an overall thickness of the display panel 1 is not increased on a basis of ensuring an electrical connection between the second sub-conductive portion 420 and the conductive layer 310, thereby meeting a requirement of the display device 10 on the overall thickness of the display panel 1.

Figure 12:
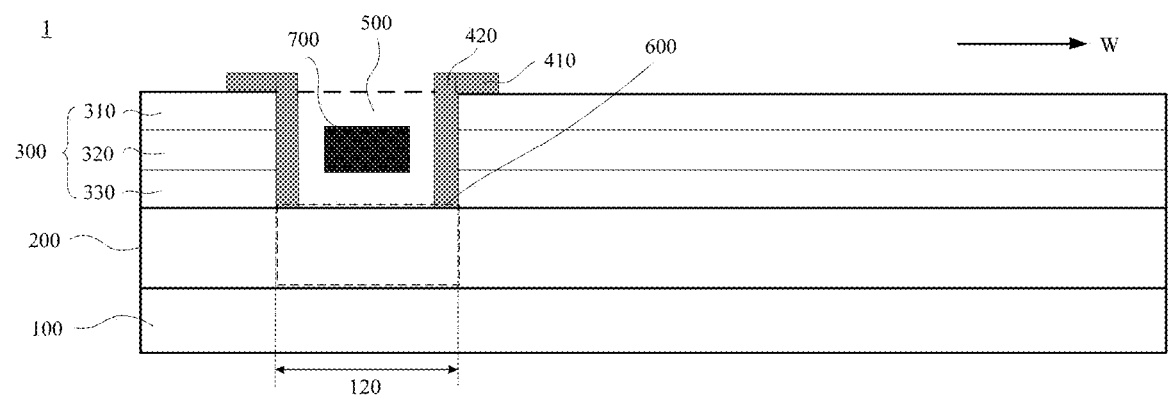
FIG. 12 is a structural diagram of yet another display panel, in accordance with some embodiments.

In some embodiments, as shown in FIG. 12, in order to increase an installation area of the sensor 700 as much as possible, a width of the third sub-conductive portion 430 is zero in the direction (i.e., the W direction) parallel to the display substrate 100.

The width of the third sub-conductive portion 430 is zero. That is, only the second sub-conductive portion 420 covers the portion of the back film 200 exposed by the pattern recognition hole 500. An end of the second sub-conductive portion 420 proximate to the display substrate 100 is in direct contact with the exposed portion of the back film 200. An end of the second sub-conductive portion 420 away from the display substrate 100 is electrically connected to the conductive layer 310, so that a coverage area of the conductive portion 400 in a region exposing the back film 200 (i.e., a region where the pattern recognition hole 500 is located) is reduced as much as possible on a basis of ensuring an electrical connection between the second sub-conductive portion 420 and the back film 200, and thus, the installation area of the sensor 700 is increased.

In some embodiments, referring to FIG. 6 again, in order to take into account the thickness of the display panel 1 and the installation area of the sensor 700, the widths of the first sub-conductive portion 410 and the third sub-conductive portion 430 are zero in the direction (e.g., the W direction in FIG. 6) parallel to display substrate 100, and the end of the second sub-conductive portion 420 away from the back film 200 is flush with the surface of the conductive layer 310 away from the back film 200.

The widths of the first sub-conductive portion 410 and the third sub-conductive portion 430 are zero. That is, only the conductive portion 400 located on the hole wall of the pattern recognition hole 500, i.e., the second sub-conductive portion 420 is remained. The end of the second sub-conductive portion 420 away from the back film 200 is flush with the surface of the conductive layer 310 away from the back film 200, and the second sub-conductive portion 420 is electrically connected to the conductive layer 310, so as to ensure that the overall thickness of the display panel 1 remains unchanged.

The end of the second sub-conductive portion 420 proximate to the display substrate 100 is in contact with the back film 200 to realize the electrical connection, so that on the basis of ensuring the electrical connection between the second sub-conductive portion 420 and the back film 200, an area of a region of the pattern recognition hole 500 occupied by the conductive portion 400 is reduced as much as possible. Therefore, in a case where the same sensor 700 is installed, an area of an opening region of the pattern recognition hole 500 may be reduced.

A sectional shape of the second sub-conductive portion 420 taken along a direction perpendicular to the display substrate 100 (i.e., the V direction in FIG. 6) is one of a rectangle, a trapezoid or a triangle, as long as an end of the second sub-conductive portion 420 is electrically connected to the conductive layer 310, and another end of the second sub-conductive portion 420 is electrically connected to the portion of the back film 200 exposed by the pattern recognition hole 500.

Figure 13:
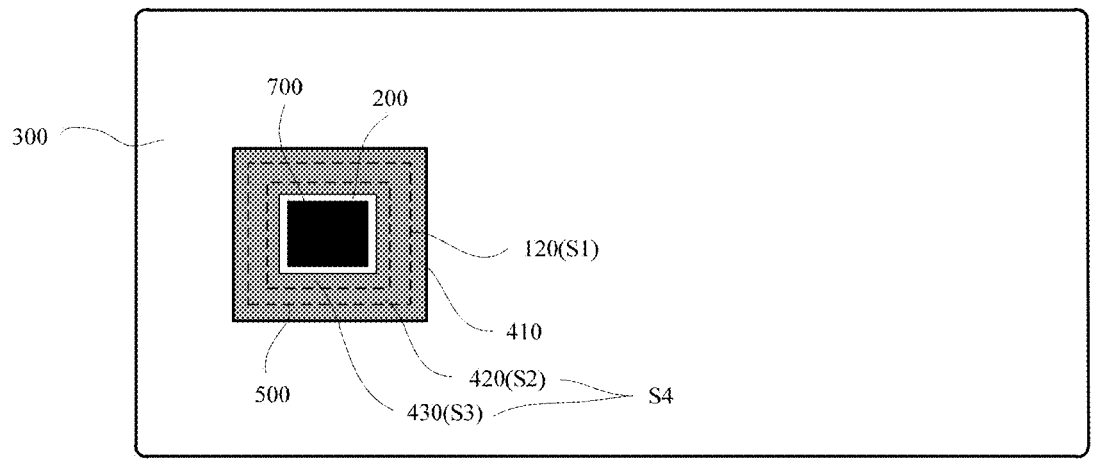
FIG. 13 is a top view of another display panel, in accordance with some embodiments.

In some embodiments, as shown in FIG. 13, an area of the orthogonal projection of the pattern recognition hole 500 on the display substrate 100 is a first area S1, an area of an orthographic projection of the second sub-conductive portion 420 on the display substrate 100 is a second area S2, and an area of an orthographic projection of the third sub-conductive portion 430 on the display substrate 100 is a third area S3. A sum of the second area S2 and the third area S3 is a fourth area S4 (i.e., S4=S2+S3).

In order not to affect the installation of the sensor 700, a difference (i.e., S1-S4) between the first area S1 and the fourth area S4 is greater than the installation area of the sensor 700. The total projected area S4, in the opening region of the pattern recognition hole 500, of the second sub-conductive portion 420 and the third sub-conductive portion 430 in the pattern recognition hole 500 is accurately defined, so that a space is reserved for the installation of the sensor 700, which is conducive to the installation and maintenance of the sensor 700.

It will be understood that as shown in FIG. 13, the sensor 700 is disposed in a region enclosed by the third sub-conductive portion 430. That is, after the portion of the back film 200 is covered by the third sub-conductive portion 430, the remaining region is sufficient for the installation of the sensor 700. In a case where the width of the third sub-conductive portion 430 is zero, after the second sub-conductive portion 420 covers a sidewall of the region where the pattern recognition hole 500 is located, the region exposing the back film 200 is sufficient for the installation of the sensor 700.

Figure 14:
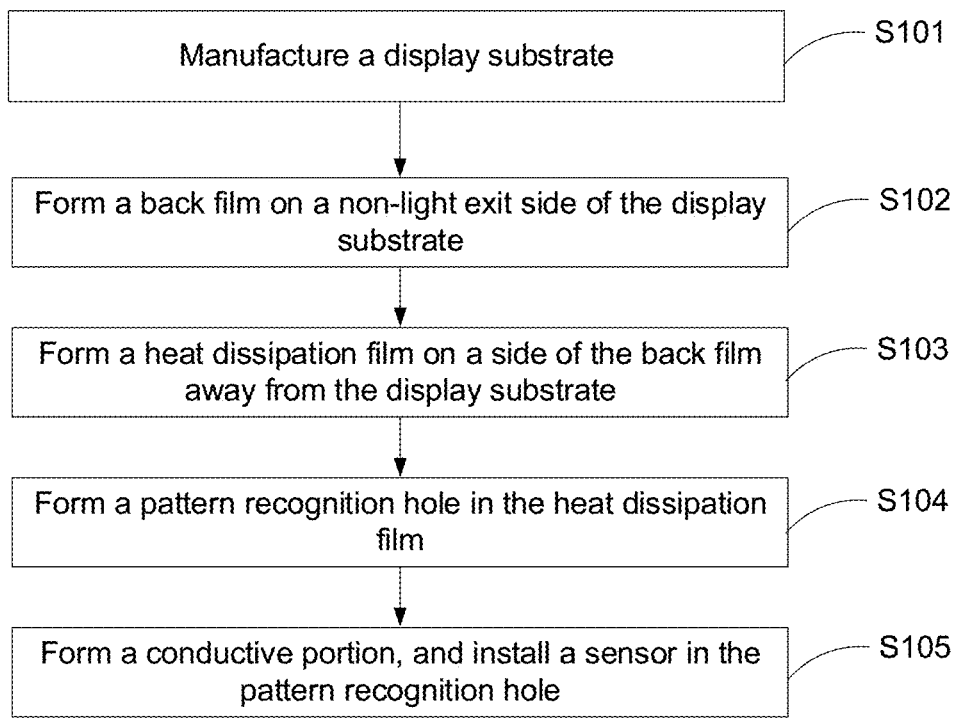
FIG. 14 is a flow diagram of a manufacturing method of a display panel, in accordance with some embodiments.

Based on the same inventive concept, as shown in FIG. 14, some embodiments of the present disclosure further provide a manufacturing method of a display panel 1, and the display panel 1 is the above display panel 1. The manufacturing method includes S101 to S105.

In S101, the display substrate 100 is manufactured.

The display panel 1 has the pattern recognition region. For example, the structure of the display substrate 100 is as shown in FIG. 3. Manufacturing the display substrate 100 mainly includes: forming the thin film transistors 130 in the pixel circuits 50, the planarization layer 140, the pixel defining layer 150, the light-emitting devices 60 and the encapsulation layer 160 on the base substrate 111. The display substrate 100 includes the active layer AL, the gate insulating layer GI, the gate metal layer GM (for forming the gates 131 of the thin film transistors 130), the interlayer dielectric layer ILD, and the source-drain metal layer SD (for forming the sources 132 and the drains 133 of the thin film transistors 130) that are all disposed on the base substrate 111.

Figure 15:
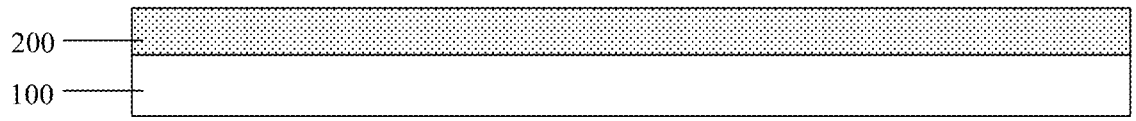
FIG. 15 is a process diagram of a manufacturing method of a display panel, in accordance with some embodiments.
Figure 16:
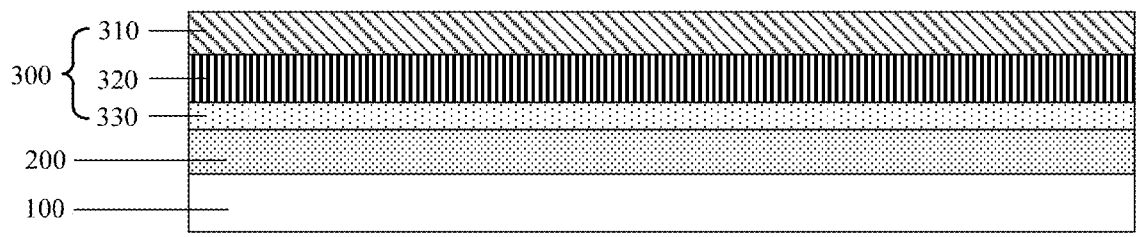
FIG. 16 is another process diagram of a manufacturing method of a display panel, in accordance with some embodiments.
Figure 17:
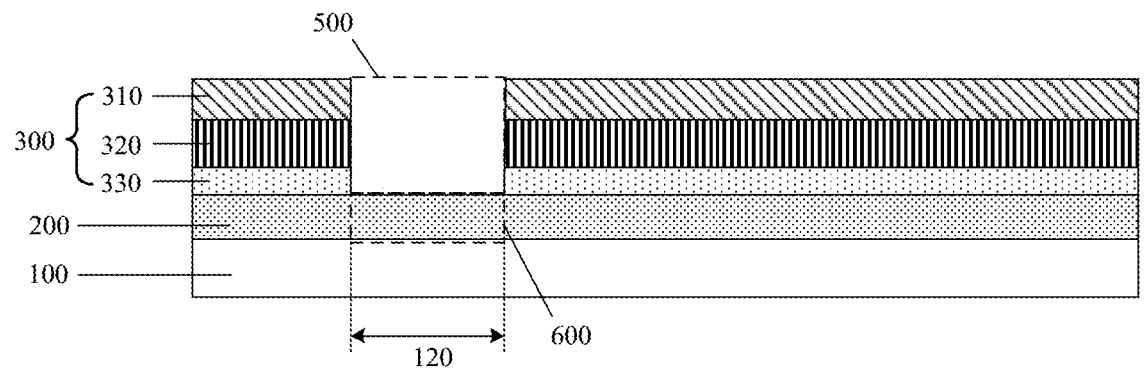
FIG. 17 is yet another process diagram of a manufacturing method of a display panel, in accordance with some embodiments.

The structure of the display substrate 100 is repeated here, and in order to simplify the drawings, the internal structure of the display substrate 100 is not drawn in following FIGS. 15 to 17.

In S102, the back film 200 is formed on the non-light exit side of the display substrate 100.

As shown in FIG. 15, the back film 200 is formed on the non-light exit side of the display substrate 100. The back film 200 may be adhered to the non-light exit side of the display substrate 100 by using an adhesive layer.

In some embodiments, in a case where the display panel 1 needs to be bent in the peripheral area BB to realize the narrow bezel of the display device 10, a portion of the back film 200 located at the bending region OO of the peripheral area BB is required to be removed (as shown in FIG. 7), thereby reducing a bending stress, and ensuring that metal wirings in the bending region are not broken. In this case, the back film 200 forms a U-shaped opening at the bending region, and the back film 200 with this structure is referred to as a U-shaped film (also called U-film).

It will be noted that S102 is not necessary in some embodiments. That is, the display panel 1 may not include the back film 200.

In S103, the heat dissipation film 300 is formed on the side of the back film 200 away from the display substrate 100.

As shown in FIG. 16, the heat dissipation film 300 includes the adhesive layer 330, the heat conduction layer 320 and the conductive layer 310 that are away from the back film 200 in sequence. The heat conduction layer 320 is used for conducting heat generated by the display substrate 100 out, so as to avoid poor display caused by damage of the display substrate 100 due to a high temperature.

The conductive layer 310 is used for grounding the display substrate 100, so as to prevent a large number of charges from being accumulated in the display substrate 100, thereby avoiding an abnormal display image due to an influence of the large number of accumulated charges on the properties of the thin film transistors 130.

The adhesive layer 330 is used for adhering the heat dissipation film 300 to the back film 200, and the adhesive layer 330 has a light-shielding function, which may prevent external light from affecting the properties of the thin film transistors 130. The adhesive layer 330 may be manufactured by spraying or spin coating.

In S104, the pattern recognition hole 500 is formed in the heat dissipation film 300.

As shown in FIG. 17, the pattern recognition hole 500 is formed in the heat dissipation film 300. The pattern recognition hole 500 penetrates the adhesive layer 330, the heat conduction layer 320 and the conductive layer 310 that are stacked, so as to expose the connection portion 600. For example, the pattern recognition hole 500 may be formed in the heat dissipation film 300 shown in FIG. 16 by laser etching.

It will be noted that in a case where the display panel 1 includes the back film 200, as shown in FIG. 17, the connection portion 600 is the portion of the back film 200 exposed by the pattern recognition hole 500. In a case where the display panel 1 does not include the back film 200, the connection portion 600 is the portion of the display substrate 100 exposed by the pattern recognition hole 500.

An order of S103 and S104 is not limited in the embodiments of the present disclosure. For example, S103 may be performed first, and then S104 is performed. That is, the heat dissipation film 300 is formed on the side of the back film 200 away from the display substrate 100 first (as shown in FIG. 16), and then the pattern recognition hole 500 is formed in the heat dissipation film 300. For another example, S104 may be performed first, and then S103 is performed. That is, the pattern recognition hole 500 is formed in the heat dissipation film 300 first, and then the heat dissipation film 300 with the pattern recognition hole 500 is adhered to the side of the back film 200 away from the display substrate 100.

The position, shape and size of the pattern recognition hole 500 are not limited in the embodiments of the present disclosure, as long as the position, shape and size of the pattern recognition hole 500 respectively correspond to the position, shape and size of the pattern recognition region 120 of the display panel 1.

In S105, the conductive portion 400 is formed, and the sensor 700 is installed in the pattern recognition hole 500. As shown in FIG. 6, the conductive portion 400 is disposed on the hole wall of the pattern recognition hole 500. An end of the conductive portion 400 is connected to the conductive layer 310, and another end of the conductive portion 400 is connected to the connection portion 600, so that induced charges accumulated at the connection portion 600 are conducted out through the conductive layer 310, so as to achieve the uniformity of the display image.

The conductive portion 400 may also include the structure shown in FIG. 9, 10, 11 or 12, which will not be repeated here. It will be noted that the arrangement of the conductive portion 400 cannot affect the installation of the sensor, and cannot block the transmission of recognition light. The coating method of the conductive portion 400 includes, but is not limited to, printing, spray coating, spin coating, evaporation, or manual coating.

In some embodiments, the conductive portion 400 may also be manufactured by using a screen printing equipment and related processes. A schematic structure of the screen printing equipment may refer to FIG. 18. The screen printing equipment includes a screen frame 2, a screen 3, a scraping plate 5 and a stamp pad 7. A partial schematic structure of the screen 3 may refer to FIG. 19.

Manufacturing the conductive portion 400 at least on the hole wall of the pattern recognition hole 500 includes R101 to R104.

In R101, the display panel 1 is placed on the stamp pad 7 of the screen printing equipment, and a light exit surface of the display panel 1 is close to the stamp pad 7, and a non-light exit surface of the display panel 1 is close to the screen 3.

Figure 18:
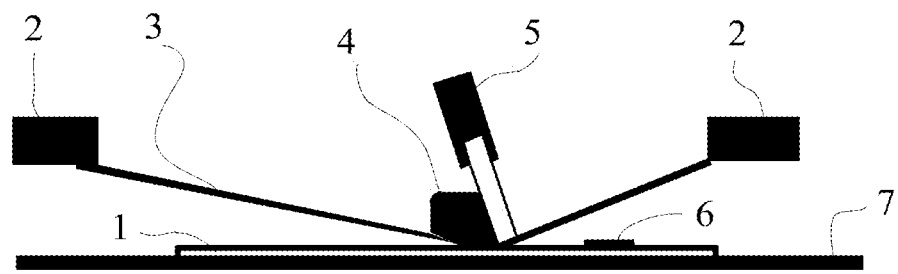
FIG. 18 is a structural diagram of a screen printing equipment for manufacturing a display panel, in accordance with some embodiments.

For example, referring to FIG. 18, the display panel 1 in which the pattern recognition hole 500 is manufactured is placed on the stamp pad 7 of the screen printing equipment. The light exit surface of the display panel 1 faces the stamp pad 7, and is in direct or indirect contact with the stamp pad 7, so that the conductive portion 400 is manufactured on a side of the display panel 1 away from the light exit surface.

In R102, an opening region of the screen 3 of the screen printing equipment is aligned with the pattern recognition hole 500, so that an orthogonal projection region of the opening region (including a plurality of meshes 31) of the screen 3 on the display panel 1 is overlapped with a region of the pattern recognition hole 500 where the conductive portion 400 needs to be manufactured.

Figure 19:
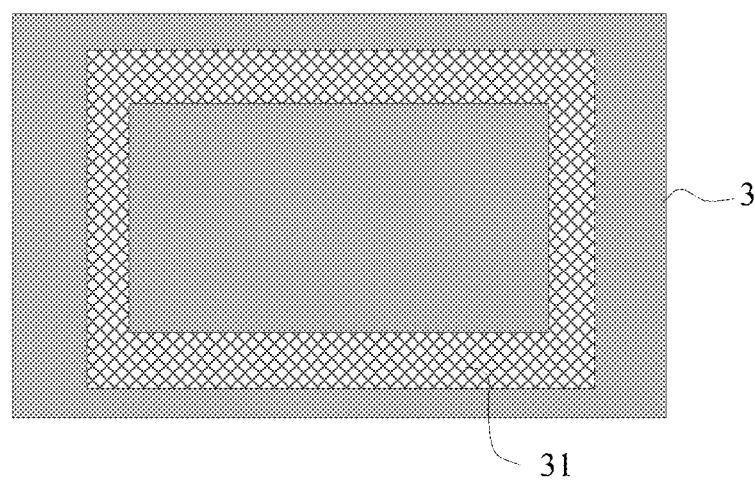
FIG. 19 is a structural diagram of a screen of the screen printing equipment shown in FIG. 18.

As shown in FIG. 19, firstly, according to the size and the position of the conductive portion 400 to be manufactured, corresponding meshes 31 are manufactured in the screen 3 in advance, then the screen 3 in which the meshes 31 are manufactured is installed on the screen frame 2, and a periphery of the screen 3 is tightened by the screen frame 2. When the conductive portion 400 is manufactured, the opening region with the plurality of meshes 31 is required to be overlapped with the region where the conductive portion 400 needs to be manufactured, so that conductive ink 4 is capable of being accurately applied to the corresponding region.

According to the number of the display panels 1 on each of which the conductive portion 400 needs to be printed, a plurality of opening regions (each opening region includes the plurality of meshes 31) may be manufactured in the same screen 3 in advance, and each opening region corresponds to the region of the pattern recognition hole 500 of the display panel 1 where the conductive portion 400 needs to be manufactured, so that the manufacturing efficiency of the conductive portion 400 may be improved.

In R103, the conductive ink 4 is coated on the screen 3.

The conductive ink 4 is coated on the screen 3, and the conductive ink 4 at the meshes 31 is scraped by using the scraping plate 5, so that the conductive ink 4 is squeezed by the scraping plate 5 from the meshes 31 to the region of the pattern recognition hole 500 where the conductive portion 400 needs to be disposed. Thus, a print 6 is left in the region of the pattern recognition hole 500 where the conductive portion 400 needs to be disposed.

In R104, the conductive ink 4 is cured to form the conductive portion 400.

Depending on a material of the conductive ink 4, the print 6 formed by the conductive ink 4 may be cured at room temperature or cured by heating. The curing time may be determined by the material, thickness and size of the conductive portion 400. After curing, the print 6 is converted into the conductive portion 400.

The conductive portion 400 is manufactured by the screen printing equipment and related manufacturing methods. On one hand, the manufactured conductive portion 400 has a regular shape and a uniform thickness, and on another hand, the manufacturing process has a high efficiency, which is conducive to saving costs.

The foregoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a pattern recognition region, wherein the display panel comprises:
   a heat dissipation film disposed on a non-light exit side of
      a display substrate of the display panel and including an adhesive layer, a heat conduction layer and a conductive layer that are away from the display substrate in sequence; wherein the heat dissipation film further includes a pattern recognition hole penetrating the adhesive layer, the heat conduction layer and the conductive layer, and an orthogonal projection of the pattern recognition hole on the display substrate is at least partially overlapped with the pattern recognition region;

a connection portion located in the pattern recognition region; wherein a surface of the connection portion away from the display substrate is exposed by the pattern recognition hole; the connection portion is included in the display substrate, or is located outside the display substrate; and a conductive portion disposed at least on a hole wall of the pattern recognition hole, wherein an end of the conductive portion is connected to the conductive layer, and another end of the conductive portion is connected to the connection portion.

2. The display panel according to claim 1, further comprising:

a back film disposed between the display substrate and the adhesive layer and configured to support the display substrate; wherein a portion of the back film located in the pattern recognition region is the connection portion.

3. The display panel according to claim 1, wherein a portion of the display substrate located in the pattern recognition region is the connection portion.

4. The display panel according to claim 1, wherein the conductive portion includes a first sub-conductive portion, a second sub-conductive portion and a third sub-conductive portion; wherein the first sub-conductive portion is located on a side of the conductive layer away from the connection portion, and is electrically connected to the conductive layer and the second sub-conductive portion;

the second sub-conductive portion is located on the hole wall of the pattern recognition hole, and is electrically connected to the third sub-conductive portion; and the third sub-conductive portion is located on the surface of the connection portion away from the display substrate, and is in contact with the connection portion.

5. The display panel according to claim 4, wherein in a direction parallel to the display substrate, a width of the first sub-conductive portion is zero; and an end of the second sub-conductive portion away from the connection portion is flush with a surface of the conductive layer away from the connection portion, and is electrically connected to the conductive layer.

6. The display panel according to claim 4, wherein in a direction parallel to the display substrate, a width of the third sub-conductive portion is zero; and an end of the second sub-conductive portion proximate to the display substrate is in contact with the connection portion.

7. The display panel according to claim 4, wherein in a direction parallel to the display substrate, a width of the first sub-conductive portion and a width of the third sub-conductive portion are zero; an end of the second sub-conductive portion proximate to the display substrate is in contact with the connection portion; and an end of the second sub-conductive portion away from the connection portion is flush with a surface of the conductive layer away from the connection portion, and is electrically connected to the conductive layer.

8. The display panel according to claim 4, wherein the second sub-conductive portion occupies the entire hole wall of the pattern recognition hole.

9. The display panel according to claim 8, wherein a sectional shape of the second sub-conductive portion taken along a direction perpendicular to the display substrate is one of a rectangle, a trapezoid or a triangle.

10. The display panel according to claim 4, wherein at least one of the first sub-conductive portion, the second sub-conductive portion and the third sub-conductive portion is a film layer with a uniform thickness.

11. The display panel according to claim 1, further comprising a sensor, wherein the sensor is configured to receive light reflected by a pattern of a contact object and form a pattern recognition image according to the reflected light.

12. The display panel according to claim 11, wherein an area of the orthogonal projection of the pattern recognition hole on the display substrate is a first area, an area of an orthographic projection of the second sub-conductive portion on the display substrate is a second area, and an area of an orthographic projection of the third sub-conductive portion on the display substrate is a third area; and a sum of the second area and the third area is a fourth area; and a difference between the first area and the fourth area is greater than an installation area of the sensor.

13. The display panel according to claim 1, wherein a material of the conductive portion includes conductive ink.

14. The display panel according to claim 13, wherein the conductive ink is conductive silver paste.

15. The display panel according to claim 13, wherein the conductive portion is manufactured by a screen printing equipment.

16. A display device, comprising the display panel according to claim 1.

17. A manufacturing method of a display panel, comprising:

manufacturing a display substrate, the display substrate having a pattern recognition region;

forming a heat dissipation film on a non-light exit side of the display substrate; the heat dissipation film including an adhesive layer, a heat conduction layer and a conductive layer that are away from the display substrate in sequence;

forming a pattern recognition hole in the heat dissipation film; the pattern recognition hole penetrating the adhesive layer, the heat conduction layer and the conductive layer; and an orthogonal projection of the pattern recognition hole on the display substrate being at least partially overlapped with the pattern recognition region; and forming a conductive portion; the conductive portion being disposed at least on a hole wall of the pattern recognition hole, and an end of the conductive portion being connected to the conductive layer, and another end of the conductive portion being connected to a portion of the display substrate exposed by the pattern recognition hole.

18. The manufacturing method according to claim 17, wherein after the display substrate is manufactured, and before the heat dissipation film is formed on the non-light exit side of the display substrate, the manufacturing method further comprises: forming a back film on the non-light exit side of the display substrate; wherein the end of the conductive portion is connected to the conductive layer, and the another end of the conductive portion is connected to a portion of the back film exposed by the pattern recognition hole.

19. The manufacturing method according to claim 17, wherein forming the conductive portion includes:
- placing the display panel on a stamp pad of a screen printing equipment, a light exit surface of the display panel being close to the stamp pad;
- aligning an opening region of a screen of the screen printing equipment with the pattern recognition hole, so that an orthogonal projection region of the opening region on the display panel is overlapped with a region of the pattern recognition hole where the conductive portion needs to be manufactured;
- coating conductive ink on the screen; and
- curing the conductive ink to form the conductive portion.

20. The manufacturing method according to claim 17, wherein after the conductive portion is formed, the manufacturing method further comprises:
- installing a sensor in the pattern recognition hole.

* * * * *